(12) United States Patent
Cripe

(10) Patent No.: US 7,391,211 B2
(45) Date of Patent: Jun. 24, 2008

(54) DIGITAL FLUXGATE MAGNETOMETER

(75) Inventor: David W. Cripe, Williamsburg, VA (US)

(73) Assignee: Continental Automotive Systems US, Inc., Auburn Hills ( * ) Notice: Subject to any disclaimer, the term of this patent is extended or adjusted under 35 U.S.C. 154(b) by 104 days.

(21) Appl. No.: 11/269,081

(22) Filed: Nov. 8, 2005

(65) Prior Publication Data

US 2007/0103152 A1    May 10, 2007

(51) Int. Cl.
G01R 33/04 (2006.01)
G01B 7/16 (2006.01)
G01L 1/12 (2006.01)

(52) U.S. Cl. .................. 324/253; 73/779; 73/862.331
(58) Field of Classification Search .............. 702/41; 324/209, 253, 254; 73/763, 779, 862.331, 73/862.335, 862.69
See application file for complete search history.

(56) References Cited

U.S. PATENT DOCUMENTS

| | | | |
|---|---|---|---|
| 4,989,460 A * | 2/1991 | Mizuno et al. | 73/862.335 |
| 5,351,555 A | 10/1994 | Garshelis | |
| 5,646,356 A * | 7/1997 | Ling et al. | 73/862.335 |
| 5,696,575 A | 12/1997 | Kohnen et al. | |
| 5,712,563 A * | 1/1998 | Kawagoe et al. | 324/207.19 |
| 5,889,215 A | 3/1999 | Kilmartin et al. | |
| 5,939,881 A | 8/1999 | Slater et al. | |
| 6,145,387 A | 11/2000 | Garshelis | |
| 6,222,363 B1 | 4/2001 | Cripe | |
| 6,298,467 B1 | 10/2001 | Chuang et al. | |
| 6,300,855 B1 | 10/2001 | Clark et al. | |
| 6,346,812 B1 | 2/2002 | May et al. | |
| 6,516,508 B1 | 2/2003 | Gandarillas | |
| 6,553,847 B2 | 4/2003 | Garshelis | |
| 6,698,299 B2 | 3/2004 | Cripe | |
| 2002/0162403 A1 * | 11/2002 | Cripe | 73/862.333 |

* cited by examiner

Primary Examiner—Reena Aurora
Assistant Examiner—Kenneth J Whittington

(57) ABSTRACT

A circuit for a fluxgate magnetometer includes a plurality of digital function blocks that are programmed as functions within a microcontroller. The microcontroller includes and implements the functions of an analog circuit to lower the cost and complexity of a digital fluxgate magnetometer circuit.

14 Claims, 2 Drawing Sheets

DIGITAL FLUXGATE MAGNETOMETER

BACKGROUND OF THE INVENTION

This invention is generally related to a fluxgate magnetometer for detecting a magnetic field. More particularly, this invention is directed toward a digital magnetometer implemented with a microcontroller.

Non-contact torque sensors utilize a magnetoelastic material applied to a torque transducer. Application of torque to the torque transducer generates a magnetic field. The generated magnetic field is detected and converted to a usable electric signal by a magnetometer. Current magnetometers utilize a fluxgate circuit to detect and convert the generated magnetic field into a usable electric signal proportional to the applied torque.

A fluxgate circuit includes a non-linear magnetic element that is contained within a coil of wire. An alternating electrical current is applied to the coil to generate an alternating magnetic field. The alternating magnetic field magnetically saturates the magnetic element twice each excitation period. An external magnetic field as is generated by the torque transducer is superimposed onto the magnetic field produced by the coil of wire causing an asymmetric saturation of the magnetic element. The asymmetry of the saturation in turn causes a voltage waveform across the coil at a frequency twice that of the excitation frequency. The amplitude and phase of this signal is used as a feedback signal to the coil. The feedback provides a stable, linear sensor response desirable for many sensing applications.

Disadvantageously, conventional fluxgate circuits are comprised of several analog components that require delicate assembly and take up valuable space. Some fluxgate circuits have digitally integrated some features, however, an analog switch is retained for performing heterodyning functions, and also includes an analog buffer device to provide current feedback.

Accordingly, it is desirable to develop and design a magnetometer that does not utilize analog components and that is implemented entirely on an integrated circuit microcontroller.

SUMMARY OF THE INVENTION

An example fluxgate magnetometer circuit according to this invention includes a microcontroller providing the function of a comparator and a gate device to provide both a feedback signal to the various fluxgates utilized to detect the magnetic field and an output utilized for communicating information indicative of the sensor value.

An example fluxgate magnetometer circuit according to this invention includes an integrated circuit that provides the various functions otherwise provided by way of separate analog components. A microcontroller provides the function of a voltage comparator that receives a signal from a common node from various fluxgates in magnetic communication with the coil assembly of the sensor. The voltage comparator provides a signal that is combined with a clock signal to a flip-flop gate circuit. The flip-flop gate circuit provides an output that is communicated through a digital filter and to a feedback loop. The feedback loop provides current to the fluxgates inducing them with a magnetic field such that the long-term average magnetic field within them is zero. The output from the digital filter is also provided as a function programmed into the microcontroller. The digital filter provides a conversion to a modulated signal that is used and encoded as is required for a system that utilizes output provided by the sensor.

Because each of these functions otherwise requiring specific analog devices in prior art functions is comprised in a single microcontroller, the cost and complexity of the magnetometer circuit is reduced. Accordingly, the fluxgate magnetometer circuit according to this invention provides reduced size and elimination of analog components, and also allows the example circuit to be easily adapted to application specific requirements.

These and other features of the present invention can be best understood from the following specification and drawings, the following of which is a brief description.

DETAILED DESCRIPTION OF THE PREFERRED EMBODIMENT

Figure 1:
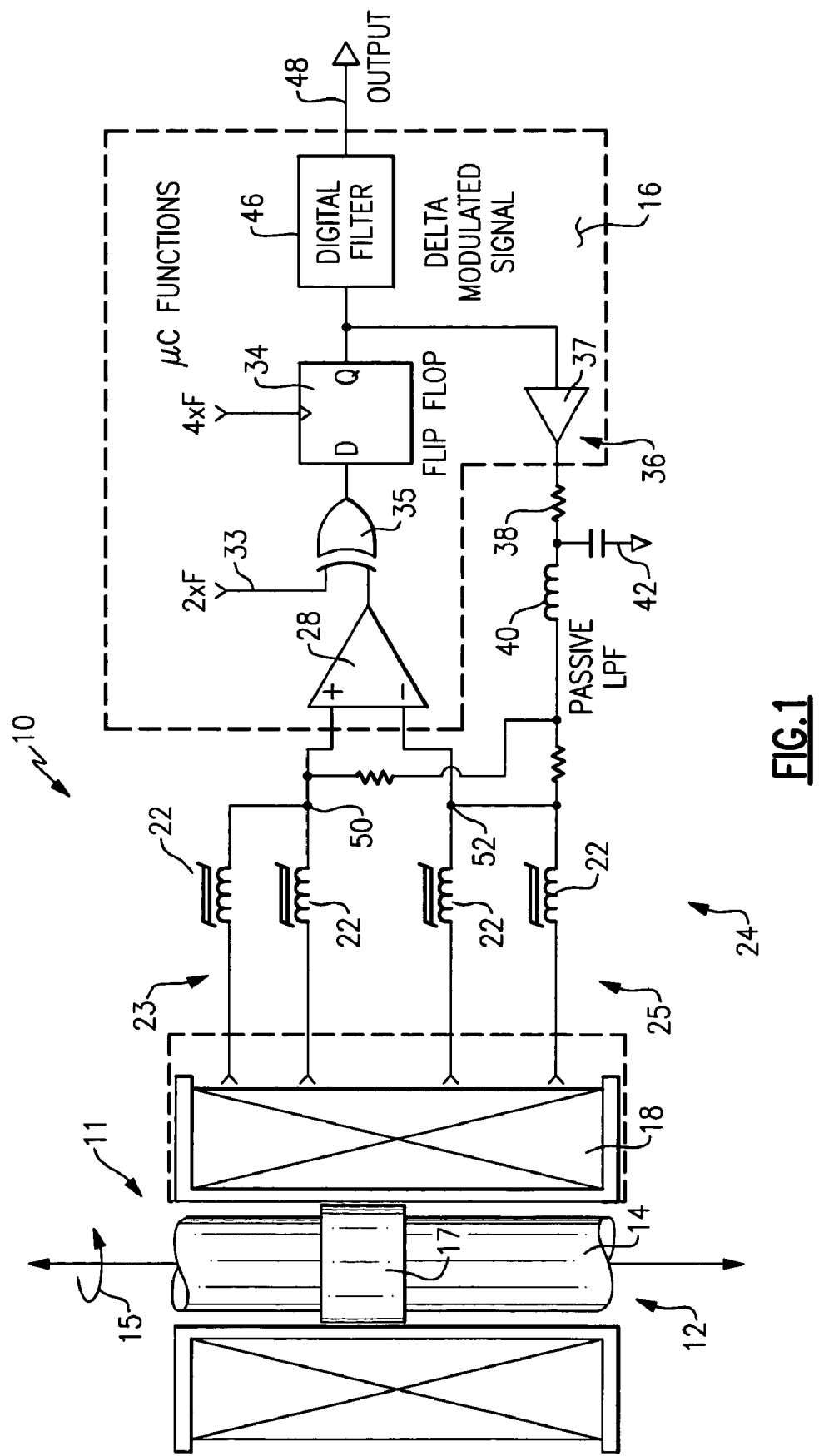
FIG. 1 is a schematic illustration of an example sensor and magnetometer assembly according to this invention.

Referring to FIG. 1, a torque sensor assembly 10 includes a sensor 11 comprising a torque transducer 12. The torque transducer 12 includes a shaft 14 that supports a ring 17. The ring 17 is comprised of a magnetoelastic material. The magnetoelastic material generates a magnetic field in response to torque 15 applied to the shaft 14. A magnetometer circuit 24 detects the magnetic field generated by the magnetoelastic ring 17.

The magnetometer circuit 24 is shown schematically in this FIG. 1 and includes a coil assembly 18 that surrounds the torque transducer 12 and is excited by an alternating current. The alternating current generates a corresponding alternating magnetic field. The alternating magnetic field in turn creates a magnetic saturation of a plurality of fluxgates 22. The fluxgates 22 comprise magnetically saturatable inductors. These inductors are embedded within the coil 18 such that alternating current within the coil 18 will alternately saturate each of the inductors.

In this example, there are two pairs of inductors 22, a first fluxgate pair 23 and a second fluxgate pair 25. Each of the fluxgate pairs are each coupled at a separate node 50, 52. The first fluxgate pair 23 is coupled at the first node 50. The second pair 25 is coupled at the second node 52.

A drive signal exerted on the coil 18 at 90°, 180° and 270° is provided. This drive signal is a periodic square-wave digital logic signal of amplitude and frequency determined and provided to saturate the fluxgates 22. The fluxgates 22 are saturated in a negative and a positive extreme depending on the bias of the alternating current. As appreciated, the alternating current includes negative and positive peaks. At each of these peaks the fluxgates 22 are magnetically saturated.

Generation of a magnetic field by the magnetoelastic ring 17 creates an imbalance in the magnetic field produced by the coil 18. Any imbalance in the magnetic field between adjacent fluxgates 22 creates an asymmetry or imbalance at the time at which saturation occurs within each of the fluxgate pairs 23, 25. It is this imbalance that results in a signal at each of the nodes 50, 52 between the fluxgates 22. The signal at each of the common nodes 50, 52 is at a frequency that is twice that of the coil drive frequency utilized to excite the coil 18.

The signal present at each of the nodes 50, 52 is a voltage waveform that provides an input to the microcontroller 16. The microcontroller 16 is programmed to provide various functions as is shown schematically in FIG. 1. The voltage signals from the nodes 50, 52 are fed to a voltage comparator 28. The microcontroller 16 provides and operates the functions of the voltage comparator 28. The resulting signal from the voltage comparator 28 is a square wave that is twice the frequency of the drive signal in either a positive or negative phase. The positive and negative phases are determined depending on the direction of the magnetic field generated by the torque transducer 12. The signal output from the voltage comparator 28 is combined with a clock signal 33. The clock signal 33 is twice that of the drive signal frequency provided for driving and exciting the coil 18. Combination occurs at the gate 35. Output of gate 35 is logic 0 or 1 depending on the direction of the magnetic field generated by the torque transducer 12. This provides a detection for the direction of the magnetic field generated by the torque transducer 12 and experienced by each of the fluxgate pairs 23, 25.

The signal from the gate 35 is then input into a flip-flop gate 34. The flip-flop gate 35 is clocked at four times the drive frequency with the clock edges nominally corresponding to 45°, 135°, and 310° relative to the fluxgate drive signal. As appreciated and discussed here and above the fluxgate drive signal is an alternating current such that an alternating magnetic field is produced that magnetically saturates each of the fluxgates 22. The output of the flip-flop gate 34 is split into two.

A first portion of the output is sent to a feedback loop generally indicated at 36. The feedback loop 36 provides a current to the flux common nodes of each of the respected flux gate pairs 23, 25. The current input by the feedback induces a magnetic field within each of the fluxgates such that an average magnetic field within each of the fluxgates is close to zero. In other words, the feedback provided by the feedback loop 36 is a current that produces a magnetic field equal to that magnetic field that is generated equal and opposite to that magnetic field that is generated by the torque transducer 12. The equal and opposite magnetic field is an accurate representation of the actual torque provided with the magnetic field generated by the magnetoelastic ring 17. Accordingly, the output of the flip-flop gate 54 is essentially the magnetic field that is seen by each of the fluxgates 22 responsive to application of torque to the torque transducer 12.

The second portion is passed to a digital filter 46. The digital filter 46 receives the same signal from the flip-flop gate 34 that is input to the feedback loop 36. The digital filter 46 is integrated within the microcontroller 16. The digital filter converts the signal from the flip-flop gate 34 into the form and recording that is required by a system to utilize data gathered from the sensor. The signal output from the digital filter 46 may be in the form of impulse modulated frequency or other type of signal modifications that are utilized to accurately generate data representative of physical parameters measured by the sensor assembly.

As appreciated, the various functions described with reference to the comparator 28, the exclusive or logic gate 35, the flip-flop gate 34 and the digital filter are all integrated as software in the microcontroller 16.

Figure 2:
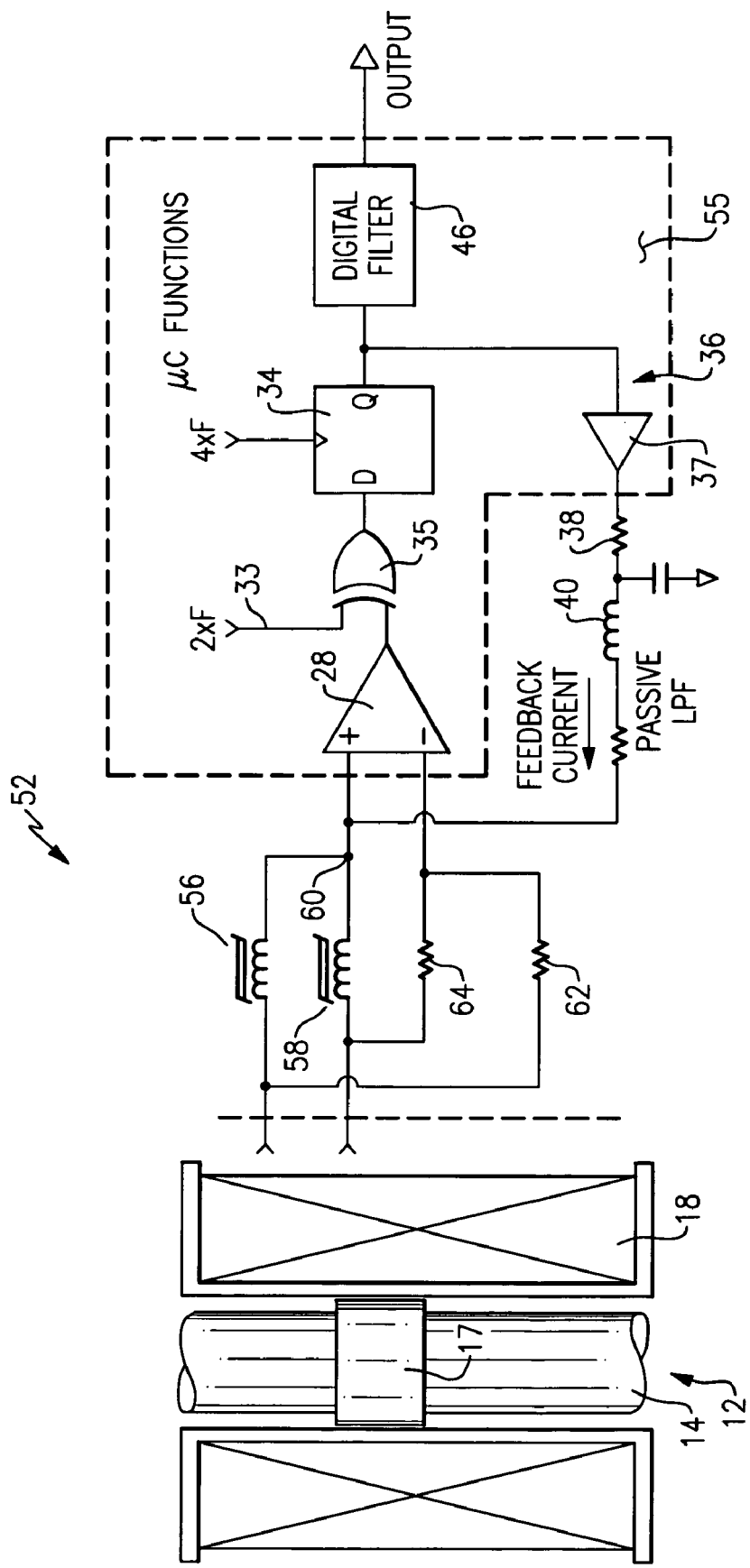
FIG. 2 is another schematic representation of an example sensor and magnetometer assembly according to this invention.

Referring to FIG. 2, another torque sensor assembly 52 according to this invention is shown. The torque sensor assembly 52 according to this invention includes a first fluxgate 56 and a second fluxgate 58 that are coupled at a common node 60. The fluxgates 56, 58 are also disposed in a parallel fashion with a first resistor 64 and a second resistor 62. The output from the node 60 is fed to a first input of the comparator 28. A second output is produced and fed through the first resistor 64 into the second input of the comparator 28.

This is an alternate simpler configuration utilizing only a first fluxgate 56 and a second fluxgate 58. The fluxgates 56 and 58 are driven by a squared current signal that is applied to the coil 18. This square wave signal provides for the alternate magnetic saturation of the fluxgates 56, 58. A reference circuit is provided that consists of two resistors connected in series across the two complementary drive amplifiers. The voltage comparator 28 compares the voltage signals of the common node 60 of the common node 63 of the resistors 64, 62. The comparator output signal is then combined with a signal twice the frequency of the fluxgate drive in an exclusive gate as indicated at 35. The signal 33 is the clock signal and is twice the frequency of the fluxgate drive signal.

The output from the exclusive logic gate 35 is input into the flip-flop gate 34 that is clocked at four times the drive frequency with the clock edges nominally corresponding with 45°, 135°, 225°, and 315° with respect to the fluxgate drive signal. The output of the flip-flop gate 34 is then digitally buffered within the digital filter 46.

As in the previous example embodiment, the signal from the flip-flop 34 is sent to the digital filter 46 and is also provided to a feedback circuit 36. The feedback circuit or loop 36 provides for additional current to the fluxgates to induce with additional current that provides a zeroing of the magnetic field. The current provides for an equal and opposite magnetic field generation with respect to the magnetic field generated by the magnetoelastic ring. Accordingly, this example utilizes only a single pair of fluxgates in combination with a pair or resistors 64, 62 simplify the circuit and components of the microcontroller 55.

Accordingly, this invention utilizes a single low cost microcontroller that stands alone and does away with the use and requirement of using analog and digital converters. Further, the microcontroller utilized in this invention can be reprogrammed for each application for which a magnetometer is required. Therefore, the magnetometer circuit of this invention is capable of being utilized for many applications and for measuring magnetic fields for differently configured torque sensors.

Further, as no analog circuit components are used in the power consumption required by the microcontroller is significantly reduced and the micro-controller can also be programmed to add additional signal processing as is required to fully utilize the capabilities of the microcontroller that are otherwise not available in analog magnetometer circuits.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A magnetometer circuit assembly comprising:
   at least one coil driven to generate an alternating magnetic filed;
   at least two magnetically saturable inductors disposed in magnetic communication with said at least one coil and coupled at a first node;
   a pair of resistors coupled to the two magnetically saturable inductors and a second node;
   a microcontroller including a first input coupled to said first node that receives a signal indicative of an imbalance in a magnetic field from said at least two magnetically saturable inductors and a first output that provides a feed back signal to said at least two magnetically saturable inductors and a second output that provides a signal indicative of a measured parameter.

2. The assembly as recited in claim 1, wherein each of said first and second nodes are coupled to said first input.

3. The assembly as recited in claim 1, wherein the microcontroller includes a voltage comparator for generating a signal resulting from a comparison of signals from the first node and a second node.

4. A magnetometer circuit assembly comprising:
a first pair of magnetically saturable inductors coupled at a first node;
a second pair of magnetically saturable inductors coupled at a second node;
a microcontroller including a first input coupled to each of said first node and said second node that receives a signal indicative of an imbalance in a magnetic field from said first pair of magnetically saturable inductors and said second pair of magnetically saturable inductors and a second output that provides a signal indicative of a measured parameter, wherein the microcontroller is programmed to provide operation of a voltage comparator including a first input coupled to said first node and a second input coupled to said second node.

5. The assembly as recited in claim 4, wherein the microcontroller is programmed to provide operation of a logic gate that receives an output from said voltage comparator and provides said feedback output and said second output.

6. The assembly as recited in claim 5, wherein said microcontroller includes a digital filter that conditions said second output such that said second output is proportional to said measured parameter.

7. The assembly as recited in claim 5, wherein said output from said voltage comparator is combined with clock signal.

8. A torque sensor assembly comprising:
a torque transducer that generates a magnetic field responsive to an applied force;
a coil surrounding said torque transducer that generates an alternating magnetic field responsive to an alternating current;
at least two magnetically saturable inductors contained within said coil and coupled at a first node;
a reference circuit comprising two resistors coupled to the at least two magnetically saturable inductors and a second node;
a microcontroller including a first input coupled to said first node that receives a signal indicative of an imbalance in a magnetic field of said at least two magnetically saturable inductors and a first output that provides a feed back signal to said at least two magnetically saturable inductors and a second output that provides a signal indicative of a measured parameter, wherein the microcontroller includes a voltage comparator for comparing a signal at the first node with a signal at the second node.

9. The assembly as recited in claim 8, wherein said at least two magnetically saturable inductors comprises a first pair of magnetically saturable inductors coupled at said first node and a second pair of magnetically saturable inductors coupled at a second node, wherein each of said first and second nodes are coupled to said first input.

10. The assembly as recited in claim 8, wherein the voltage comparator generates an output signal that indicative of a direction of the alternating magnetic field.

11. A torque sensor assembly comprising:
a torque transducer that generates a magnetic field responsive to an applied force;
a coil surrounding said torque transducer that generates an alternating magnetic field responsive to an alternating current;
a first pair of magnetically saturable inductors coupled at a first node;
a second pair of magnetically saturable inductors coupled at a second node;
a microcontroller including a first input coupled to said first node an said second node that receives a signal indicative of an imbalance in a magnetic field of said first and second pair of magnetically saturable inductors and a first output that provides a feed back signal to said first and second pair of magnetically saturable inductors and a second output that provides a signal indicative of a measured parameter, wherein the microcontroller is programmed to provide operation of a voltage comparator including a first input coupled to said first node and a second input coupled to said second node.

12. The assembly as recited in claim 11, wherein the microcontroller is programmed to provide operation of a logic gate that receives an output from said voltage comparator and provides said feedback output and said second output.

13. The assembly as recited in claim 12, wherein said output from said voltage comparator is combined with a clock signal.

14. The assembly as recited in claim 11, wherein said microcontroller includes a digital filter that conditions said second output such that said second output is proportional to said measured parameter.

* * * * *